(12) United States Patent
Tailliet

(10) Patent No.: US 8,572,351 B2
(45) Date of Patent: Oct. 29, 2013

(54) MEMORY DEVICE WITH SERIAL PROTOCOL AND CORRESPONDING METHOD OF ADDRESSING

(75) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 219 days.

(21) Appl. No.: 12/902,707

(22) Filed: Oct. 12, 2010

(65) Prior Publication Data
US 2011/0087856 A1    Apr. 14, 2011

(30) Foreign Application Priority Data
Oct. 13, 2009    (FR) ...................................... 09 57155

(51) Int. Cl.
*G06F 13/00* (2006.01)
(52) U.S. Cl.
USPC ........... 711/203; 711/103; 711/154; 711/202; 711/211; 712/211
(58) Field of Classification Search
USPC ........... 711/203, 103, 154, 202, 211; 712/211
See application file for complete search history.

(56) References Cited

U.S. PATENT DOCUMENTS

| | | | |
|---|---|---|---|
| 5,561,777 A * | 10/1996 | Kao et al. ........................... | 711/5 |
| 6,148,388 A | 11/2000 | Wu et al. | |
| 6,212,616 B1 * | 4/2001 | Arimilli et al. ............... | 711/220 |
| 6,246,121 B1 * | 6/2001 | Dandia et al. ................. | 257/778 |
| 6,393,543 B1 | 5/2002 | Vilkov et al. | |
| 2003/0023811 A1 * | 1/2003 | Kim et al. ...................... | 711/114 |
| 2004/0105336 A1 * | 6/2004 | Choi et al. ............... | 365/230.06 |
| 2006/0004955 A1 * | 1/2006 | Ware et al. ...................... | 711/106 |

FOREIGN PATENT DOCUMENTS

WO    WO 2009/089612 A1    7/2009

OTHER PUBLICATIONS

Institut National De La Properiete Industrielle, Rapport De Recherche Preliminaire (Preliminary Search Report), issued in France Patent Application No. FR 09-57155 on Jun. 1, 2010 (2 pages).

* cited by examiner

*Primary Examiner* — Jae Yu
(74) *Attorney, Agent, or Firm* — Slater & Matsil, L.L.P.

(57) ABSTRACT

The memory device comprises a physical memory plane (PMP) comprising m first physical lines (RGP1$i$) extending along a first direction and n second physical lines (RGP2$j$) extending along a second direction, reception means for receiving a logical address (ADR) designating a first logical line (RG1$i$) and a second logical line (RG2$j$) of a matrix logical memory plane (PML), possessing $2^p$ first logical lines extending along the first direction and $2^q$ second logical lines extending along the second direction, in that m and n are each different from a power of two, m being a multiple of $2^k$, k being less than or equal to p, and the product of m and n being equal to the nearest integer above $2^{p+q}$, and in that it comprises means for addressing the physical memory plane (PMP) that are configured to address a first physical line and a part only of a second physical line on the basis of the content of the said logical address received on and of the remainder of a Euclidean division of a part of the content of this logical address received by $m/2^k$.

37 Claims, 22 Drawing Sheets

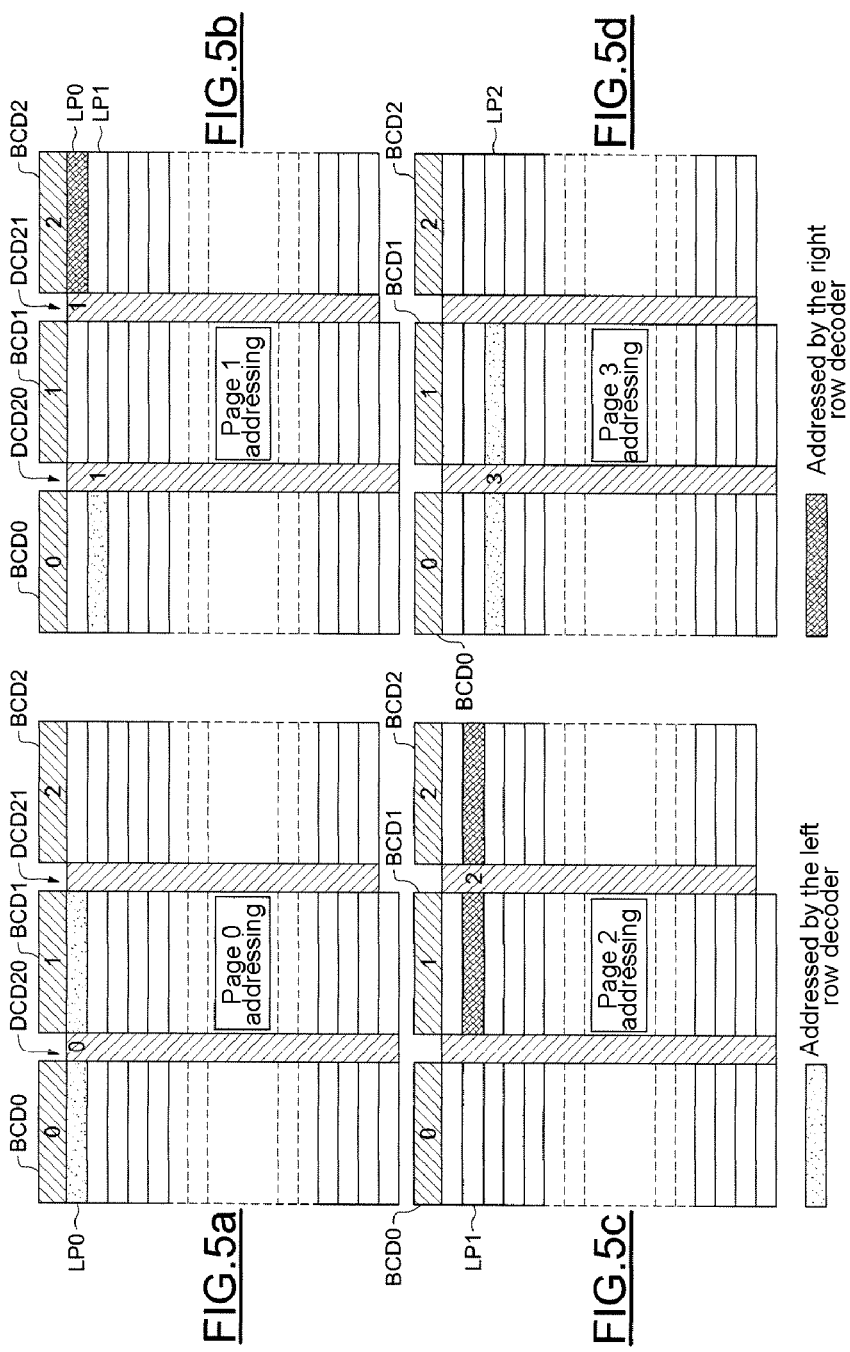

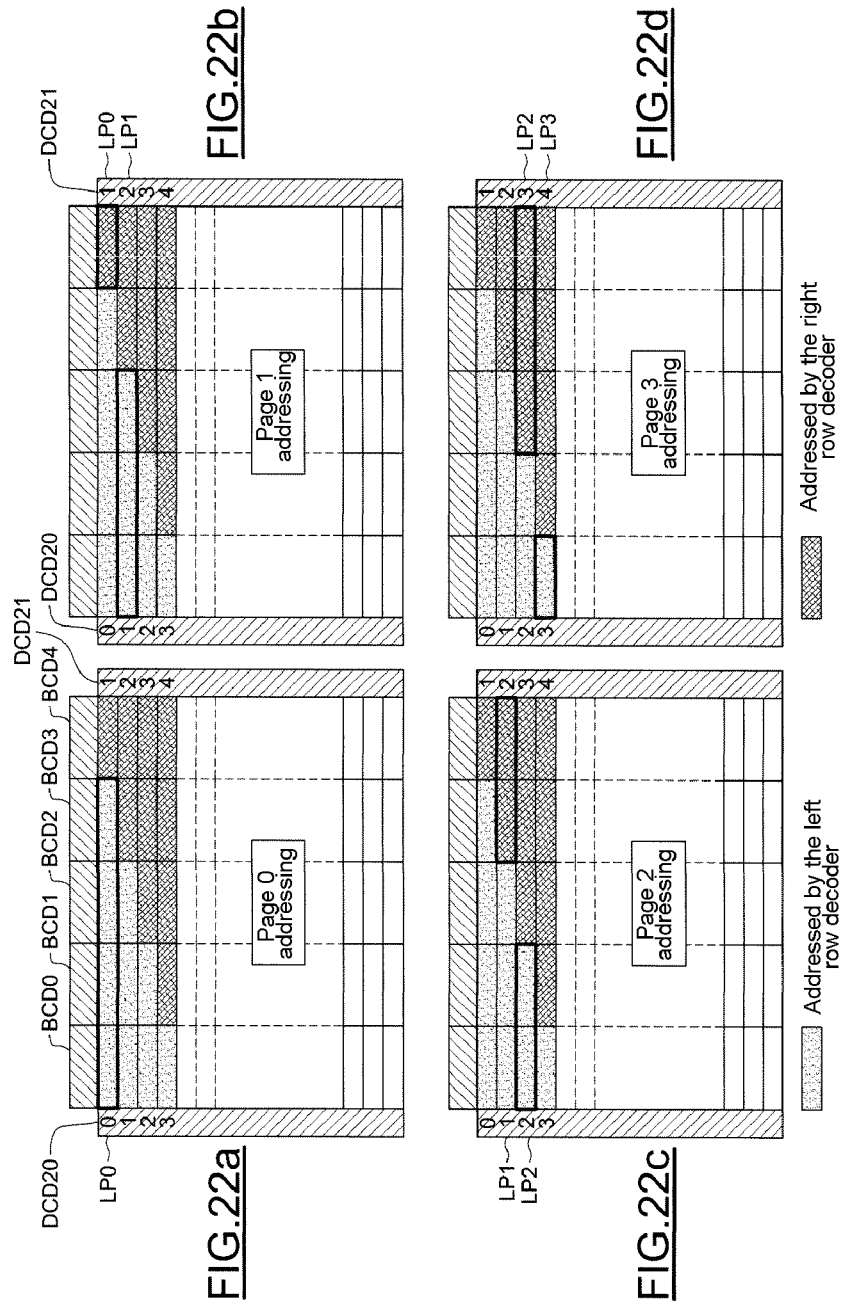

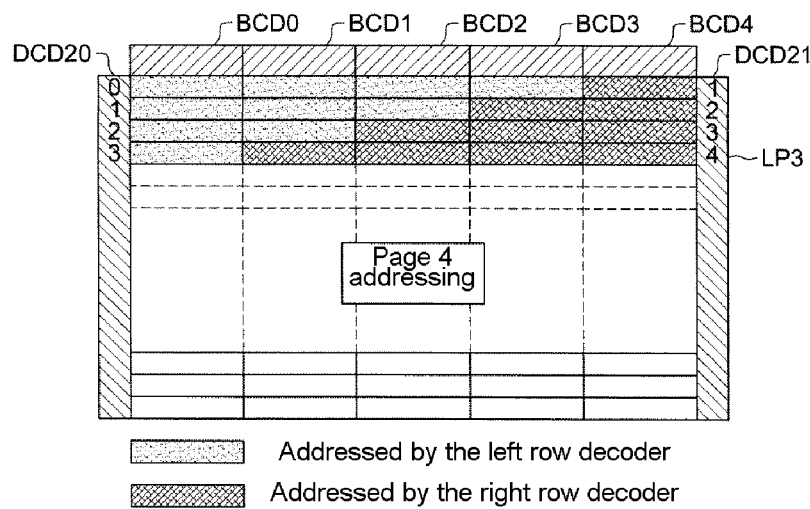

MEMORY DEVICE WITH SERIAL PROTOCOL AND CORRESPONDING METHOD OF ADDRESSING

This application claims priority to French Patent Application 09-57155, which was filed Oct. 13, 2009 and is incorporated herein by reference.

TECHNICAL FIELD

The invention relates to memories, in particular those operating with a serial protocol, and more particularly the placing of such memories in a package. The invention applies advantageously but non-limitingly to nonvolatile memories of electrically erasable and programmable type (EEPROM).

BACKGROUND

The current aim is to offer the biggest memory density within the smallest possible package. Memories having a capacity of 1 Megabit housed in packages of SO8N type currently exist. The next step is to offer an SO8N package containing a memory having a capacity of 2 Megabits.

The constraint is to make the memory circuit fit into the room available in the package. Currently for a 2-Megabit memory, most of the area is occupied by the memory plane, the routing of which cannot easily be adapted as is done for the peripheral circuits. Indeed, the memories are organized into matrices with a number of rows and a number of columns equal to a power of 2. Therefore, the memory plane has a given form and the routing of the peripheral circuits is optionally done so as to adapt the form of the circuit to the desired package.

Various versions of a given package exist. They are inter alia characterized by the dimension of the metal plate at the centre of the package on which the microchip supporting the memory circuit is glued. This metal plate determines the maximum dimension of the microchip, which must be smaller than the former, with a defined minimum margin.

When the dimensions of the microchip are significant, the largest possible metal plate is chosen and one attempts to design the periphery of the memory circuit so as to adapt it to the dimension of this metal plate. It sometimes happens that the assembly rules have to be violated, or that non-standard plates are used, this often resulting in cost overrun and production and quality problems. In all cases, the margin for manoeuvre is low.

The worst case is that of memories of large capacity whose area attains the maximum area available in the package, since the X and Y dimensions of the memory plane are imposed. The low proportion of the area at the periphery with respect to the area of the memory plane thus gives little flexibility as regards the adaptation of the dimensions of the circuit to the form of the metal plate. An impossibility may then be reached.

This is all the more critical for page-programmable memories, such as for example the EEPROM memories organized into memory pages. Indeed for this type of memory, a page is the quantity of data (bytes for example) that can be programmed simultaneously. And this page constraint further limits the architecture of the memory.

SUMMARY OF THE INVENTION

According to one mode of implementation, a memory device is provided, comprising a physical memory plane comprising m first physical lines extending along a first direction and n second physical lines extending along a second direction. The memory device further includes reception means for receiving a logical address designating a first logical line and a second logical line of a matrix logical memory plane. The matrix logical memory plane possesses $2^p$ first logical lines extending along the first direction and $2^q$ second logical lines extending along the second direction. The values m and n are each different from a power of two, m being a multiple of $2^k$, k being less than or equal to p, and the product of m and n being equal to the nearest integer above $2^{p+q}$. The memory device further includes means for addressing the physical memory plane configured to address a first physical line and a part only of a second physical line on the basis of the content of the said logical address received and of the remainder of a Euclidean division of a part of the content of this logical address received by $m/2^k$.

In another aspect, a memory device is provided, comprising a memory plane having n rows and m columns n and m each being different from a power of two, m being a multiple of $2^k$, k being a positive integer. The memory device also includes column decoding means comprising a plurality of decoding blocks respectively assigned to blocks of $2^k$ columns. The memory device further includes row decoding means comprising a plurality of row decoders each configured to access only a part of the memory plane.

In yet another aspect, a method of addressing a memory device is contemplated. The memory device includes a physical memory plane corresponding to a matrix logical memory plane, possessing $2^p$ first logical lines extending along a first direction and $2^q$ second logical lines extending along a second direction, the physical memory plane comprising m first physical lines extending along the first direction and n second physical lines extending along the second direction, m and n each being different from a power of two, m being a multiple of $2^k$, k being less than or equal to p, and the product of m and n being equal to the nearest integer above $2^{p+q}$. The method includes receiving a logical address designating a first logical line and a second logical line, and addressing of a first physical line and of a part only of a second physical line on the basis of the content of said logical address and of the remainder of a Euclidean division of a part of the content of the logical address by $m/2^k$.

BRIEF DESCRIPTION OF THE DRAWINGS

Other advantages and characteristics of the invention will be apparent on examining the detailed description of wholly non-limiting embodiments and modes of implementation, and the appended drawings in which:

FIGS. 5a to 5d, 6 and 7 schematically illustrate an exemplary addressing of a physical memory plane according to the invention;

FIGS. 22a to 22e and 23 schematically illustrate another exemplary memory device according to the invention.

DETAILED DESCRIPTION OF ILLUSTRATIVE EMBODIMENTS

Figure 1:
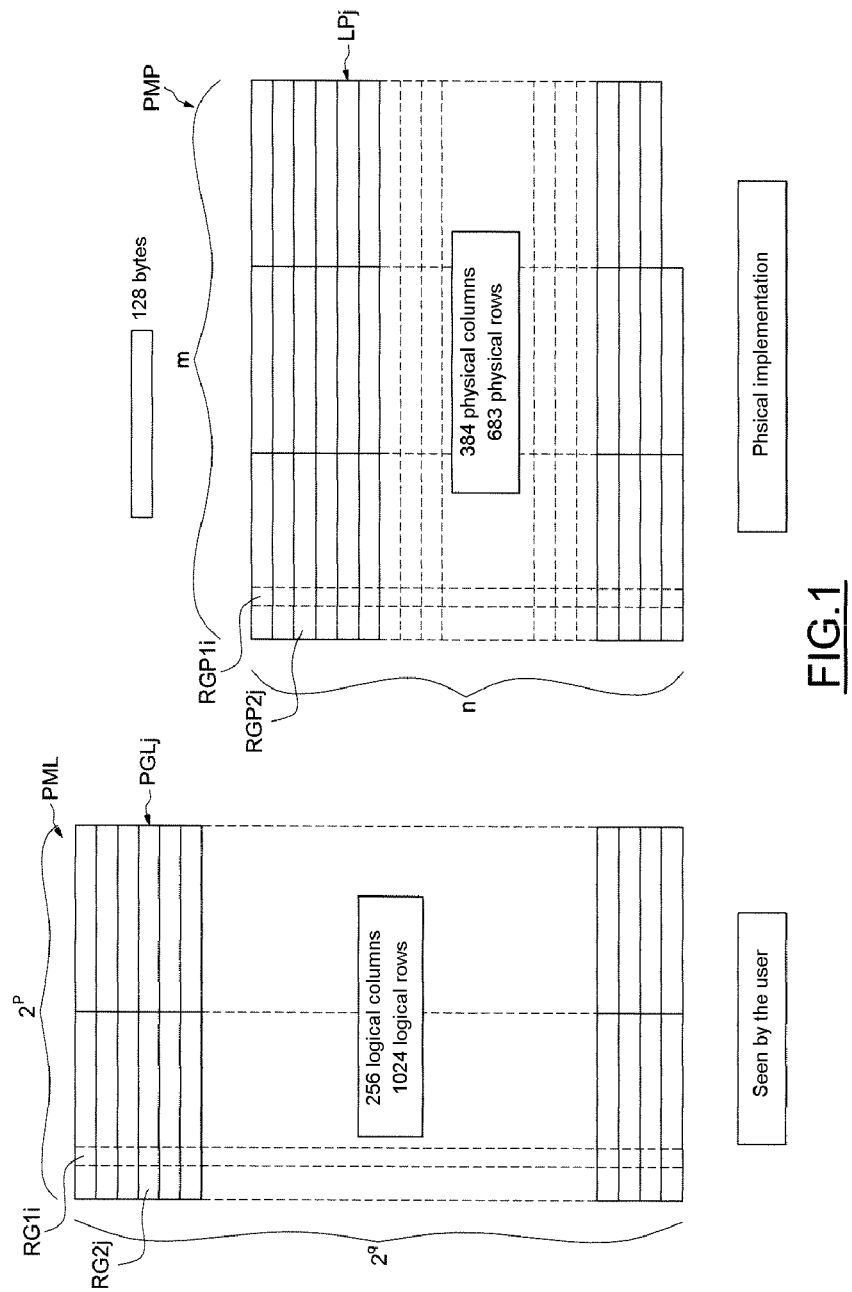
FIG. 1 schematically illustrates an example of a logical memory plane and of a physical memory plane according to the invention.

Prior to describing the embodiments in specific details, various embodiments and features of the embodiments will be described generally. In general, it is proposed that the form of a memory plane of a memory be modified so as to be able to adapt with greater ease the form of the memory circuit to the dimension of the metal plate of the package, this being particularly difficult in the case of memories organized into pages, such as for example EEPROM memories, having regard to the significant architecture constraint related to the possible page-based programming. It then becomes possible to place a memory in a smaller package than that usually used.

According to one embodiment, adapted in particular but not limitingly to page-programmable serial EEPROM memories, provision is made to modify the form of the memory plane in such a way that the number of lines (rows) and of columns is not a power of 2. Moreover, the columns are addressed by a very simple address decoding using a Euclidean division performed on the fly, this being allowed by the serial protocol. Finally, a memory plane equipped with several row decoders is used, each row decoder being able to access only a particular part of the memory plane and moreover, not decoding all the rows sequentially.

More generally, and according to one aspect, there is proposed a memory device, in particular of serial protocol type, comprising a physical memory plane comprising m physical lines extending along a first direction (for example m columns) and n second physical lines extending along a second direction (for example n rows); the memory device moreover comprises reception means for receiving a logical address designating a first logical line and a second logical line of a matrix logical memory plane possessing $2^p$ first logical lines extending along the first direction, and $2^q$ second logical lines extending along the second direction;

m and n are each different from a power of 2, m is a multiple of $2^k$, or $k$ is an integer less than or equal to p, and the product of m and n is equal to the nearest integer above $2^{p+q}$;

the device moreover comprises means for addressing the physical memory plane, configured to address a first physical line (for example a column) and a part only of a second physical line (for example a row) on the basis of the content of the said logical address received and of the remainder of a Euclidean division of a part of the content of this logical address received by $m/2^k$.

Thus, for a memory possessing 256 logical columns (p=8) and 1024 logical rows (q=10) and if we choose k=7 ($2^k$=128), it is possible to adopt a physical memory plane comprising 384 physical columns (m=384; m=3×$2^7$) and 683 physical rows.

The addressing of the memory plane will be performed on the basis in particular of the remainder of a Euclidean division by 3 (384/128) with for example, as will be seen in greater detail hereinafter, two row decoders only, each of the row decoders decoding only two thirds of the logical rows.

The logical address received comprises a first field, for example a column field, associated with the said first logical line, and a second field, for example a row field, associated with the second logical line. According to one embodiment compatible with a memory with serial protocol, the addressing means comprise first decoding means comprising calculation means configured to perform on the fly the Euclidean division of the content of the said second field by $m/2^k$, and first selection means, configured to select the said first physical line on the basis of the content of the said first field and of the remainder of the Euclidean division.

The serial protocol indeed makes it possible to perform the Euclidean division on the fly, that is to say for example at the tempo at which the address bits are received; stated otherwise the Euclidean division is performed bitwise in a manner that is synchronous with the arrival of the bits.

The addressing means moreover comprise second decoding means configured to address the said part of the said second physical line on the basis of the content of the said second field.

According to one embodiment, the calculation means comprise a remainder register intended to sequentially receive the bits of the second field, high-order bit first, and a logic circuit looped back to the remainder register and configured to sequentially deliver to the remainder register the binary value of the remainder of the Euclidean division by $m/2^k$ of the dividend formed by the content of the remainder register concatenated on the right with the current bit received from the second field. Stated otherwise, the remainder register serves at one and the same time for storing the successive dividends and the final remainder of the Euclidean division.

The remainder register thus possesses for example nb+1 stages, where nb designates the number compatible with the maximum binary value of the remainder of the said Euclidean division (nb=2 for a Euclidean division by three in which the binary maximum value of the remainder is equal to 1 0), and the logic circuit possesses nb+1 inputs coupled to the nb+1 stages of the register and nb outputs coupled to nb first stages of the remainder register.

The reception means advantageously comprise a first address register, for example a column address register, configured to store the content of the first field, and a second address register, for example a row address register, configured to store the content of the second field. The first address register possesses a carry output connected to an incrementation input of the second address register.

According to one embodiment allowing, in particular, a sequential read of the memory, the remainder register comprises an incrementation input, the second address register comprises a carry output, and the first decoding means comprise control means possessing a control input intended to receive a sequential-read control signal, a first input connected to the carry output of the first address register, a second input connected to the carry output of the second address register, and a control output connected to the incrementation input of the remainder register, and intended to deliver an incrementation control signal whose logic value is conditioned by the value of the sequential-read control signal and by the values of the signals present at the first input and at the second input.

The remainder register moreover advantageously comprises supervision means configured to authorize a sequential and cyclic incrementation of the value of the content of the remainder register between the zero binary value and the binary value corresponding to $m/2^{k-1}$. Thus, the value $m/2^k$, which is a prohibited value, is never attained by the remainder register.

Although it is possible, in certain applications, to use the quotient of the Euclidean division to decode the second logical lines, for example the rows, it is particularly simple that the second decoding means comprise several second decoders capable of decoding all the second logical lines, each second decoder being configured to decode only certain of the second logical lines, and the decoder or each decoder assigned to the second logical line designated by the content of the second field of the said logical address received is configured to access a part only of a second physical line. Such an embodiment is otherwise compatible with a sequential read of the memory and with a programming of the memory in page mode.

Although it is possible to use for example electronic programming means capable of authorizing only access to merely a part of a second physical line for a second decoder, it is simpler to provide a physical hard-wiring that limits the access of the second decoders to the parts of second physical lines. Although it is possible to use more than two second decoders, it is particularly simple to use only two second decoders.

Thus, in such a case, one of the second decoders can be configured to be able to sequentially decode the second logical lines from the first one while omitting to decode one logical line out of $m/2^k$ and the other second decoder can be configured to be able to sequentially decode the logical lines from the second one, while omitting to decode one logical line out of $m/2^k$.

According to one embodiment, m is equal to $2^p+2^k$, k being a positive or zero integer and less than or equal to p−1.

According to one embodiment, corresponding for example to an organization of the memory into memory pages, the $2^q$ second logical lines of the logical memory plane correspond to $2^q$ logical pages each comprising $2^p$ logical memory locations configured to store respectively $2^p$ data, and the physical memory plane comprises n physical pages of which n−1 out of the n each comprise $2^p+2^k$ physical memory locations and each correspond to a logical page and to a part of a logical page of neighbouring rank, and one of which comprises $2^p$ physical memory locations and corresponds to a part at least of a logical page.

According to one embodiment, the first selection means comprise $1+2^{p-k}$ (decoding blocks, each decoding block being configured to address the physical memory plane in blocks of $2^k$ data on the basis of the k low-order bits of the first field and connected to a block of $2^k$ first physical lines, a selection module configured to select a decoding block from among the $1+2^{p-k}$ decoding blocks on the basis of the remainder of the said Euclidean division and of the p−k high-order bits of the said first field.

The second decoders, for example the row decoders, can be disposed between at least some of the blocks of $2^k$ first physical lines.

As a variant, when provision is made to use only two second decoders, the latter can be disposed respectively at two ends of the physical memory plane. The memory plane can be of the nonvolatile and electrically erasable and programmable type.

According to another aspect, there is proposed a package containing a memory device such as defined above, this package possibly being of the SO8N type, such as defined by the JEDEC standard, or else a package of the TSSOP8 type, and containing a memory device of capacity greater than 1 Megabit, for example 2 Megabits.

According to another aspect, there is proposed a method of addressing a memory device, in particular of serial protocol type, comprising a physical memory plane corresponding to a matrix logical memory plane, possessing $2^p$ first logical lines extending along a first direction and $2^q$ second logical lines extending along a first direction, the physical memory plane comprising m first physical lines extending along the first direction and n second physical lines extending along the second direction, m and n each being different from a power of two, m being a multiple of $2^k$, k being less than or equal to p, and the product of m and n being equal to the nearest integer above $2^{p+q}$, method comprising a first mode of addressing comprising a reception of a logical address designating a first logical line and a second logical line and an addressing of a first physical line and of a part only of a second physical line on the basis of the content of the said logical address and of the remainder of a Euclidean division of a part of the content of this logical address by $m/2^k$.

According to one mode of implementation, the said logical address comprises a first field associated with the said first logical line and a second field associated with the said second logical line, and the said addressing comprises a calculation of the remainder of a Euclidean division, advantageously performed on the fly, of the content of the said second field by $m/2^k$ and a selection of the said first physical line on the basis of the content of the said first field and of the said remainder of the Euclidean division, and an addressing of the said part of the said second physical line on the basis of the content of the said second field.

According to one mode of implementation, the calculation of the said remainder comprises a sequential storage of the bits of the second field, high-order bit first, in a remainder register and a calculation and a sequential delivery to the remainder register of the binary value of the remainder of the Euclidean division by $m/2^k$ of the dividend formed by the current content of the remainder register concatenated on the right with the current bit received from the second field.

According to one mode of implementation, the method furthermore comprises a sequential read mode comprising, after reception of a logical address and calculation of a first value of the remainder of the Euclidean division, a sequential and cyclic incrementation of the value of the content of the remainder register from the said first value and between the zero binary value and the binary value corresponding to $m/2^k-1$.

According to one mode of implementation, the addressing of the parts of second physical lines is performed with several second decoders capable of decoding all the second logical lines, each second decoder is configured to decode only certain of the second logical lines, and a part only of a second physical line is accessed with the decoder or each decoder assigned to the second logical line designated by the content of the second field of the said logical address received.

According to one mode of implementation, only two second decoders are used.

According to one mode of implementation, one of the second decoders is configured to be able to sequentially decode the said logical lines from the first one while omitting to decode one logical line out of $m/2^k$, and the other second decoder is configured to be able to sequentially decode the said logical lines from the second one while omitting to decode one logical line out of $m/2^k$.

According to one mode of implementation, the method applies to the addressing of a memory plane in which m is equal to $2^p+2^k$, k being a positive or zero integer and less than or equal to p−1.

The method also finds a very advantageous application to page-programmable memories and also applies in particular to the addressing of a memory plane in which the $2^q$ second logical lines of the logical memory plane correspond to $2^q$ logical pages each comprising $2^p$ logical memory locations configured to store respectively $2^p$ data, and the physical memory plane comprises n physical pages of which n−1 out of the n each comprise $2^p+2^k$ physical memory locations and each correspond to a logical page and to a part of a logical page of neighbouring rank, and one of which comprises $2^p$ physical memory locations and corresponds to a part at least of a logical page.

In this case, and according to one mode of implementation, the selection of the said first physical line on the basis of the content of the said first field and of the said remainder of the Euclidean division comprises a selection of a block of $2^k$ first physical lines on the basis of the remainder of the said Euclidean division and of the p−k high-order bits of the said first field, and a selection of the said first physical line on the basis of the k low-order bits of the first field.

Turning now to embodiment illustrated in FIG. 1, the reference PML designates a logical memory plane, that is to say a memory plane seen by the user, comprising $2^p$ first logical lines RG1$i$ (columns in this example) and $2^q$ second logical lines RG2$j$ (rows in this example).

In this example, the logical memory plane comprises 256 logical columns (p=8) and 1024 (q=10) logical rows. The memory is moreover, seen by the user, organized into pages, that is to say each of the logical rows corresponds to a logical page PGL$j$ of the memory. And here each page comprises two groups of 128 memory locations or "columns" corresponding to two groups of 128 bytes. Indeed, each memory location of the memory is able to store a data item on eight bits. The page thus represents the quantity (here 256) of bytes that can be programmed simultaneously.

Consequently, here the memory is a memory with a capacity of 2 Megabits. This memory is in this example an EEPROM memory with serial protocol compatible with the $I^2C$ or SPI serial buses.

So as to be able to place such a memory in a package of SO8N type, the memory plane is physically implemented as illustrated for example on the right part of FIG. 1. More precisely, the physical memory plane PMP comprises m first physical lines or columns RGP1$i$ and $n$ second physical lines or rows RGP2$j$. In this example, m is equal to 384 and n is equal to 683. It is therefore noted that m and n are both different from a power of 2. Moreover, m is a multiple of 128 ($2^k$ with k=7). Finally, the product m times n is here equal to the nearest integer above 256×1024.

The physical memory plane PMP is here also organized into pages LP$j$. The physical pages comprise 384 bytes and each physical page LP$j$ corresponds to 1.5 logical pages PGL$j$, PGL$j$+1.

Seen by the user, the logical memory plane PML is addressable with logical addresses ADR (FIG. 2) comprising a first address field CH1 (column field) and a second address field CH2 (row field). A logical address ADR therefore designates a logical row and a logical column of the logical memory plane PML.

In the example described here, the column field comprises eight bits A0-A7, while the row field comprises 10 bits A8-A17. The memory device is here of the serial protocol type, that is to say it receives serially, in tempo with a clock signal, the data (whether these data are data bits or else address bits).

The various bits of the address ADR are thus stored sequentially in synch with the clock signal in a column register RAC and in a row register RAL which operate in this regard as shift registers. The last stage C7 of the column register RAC is linked to the first stage R0 of the row register RAL.

Figure 2:
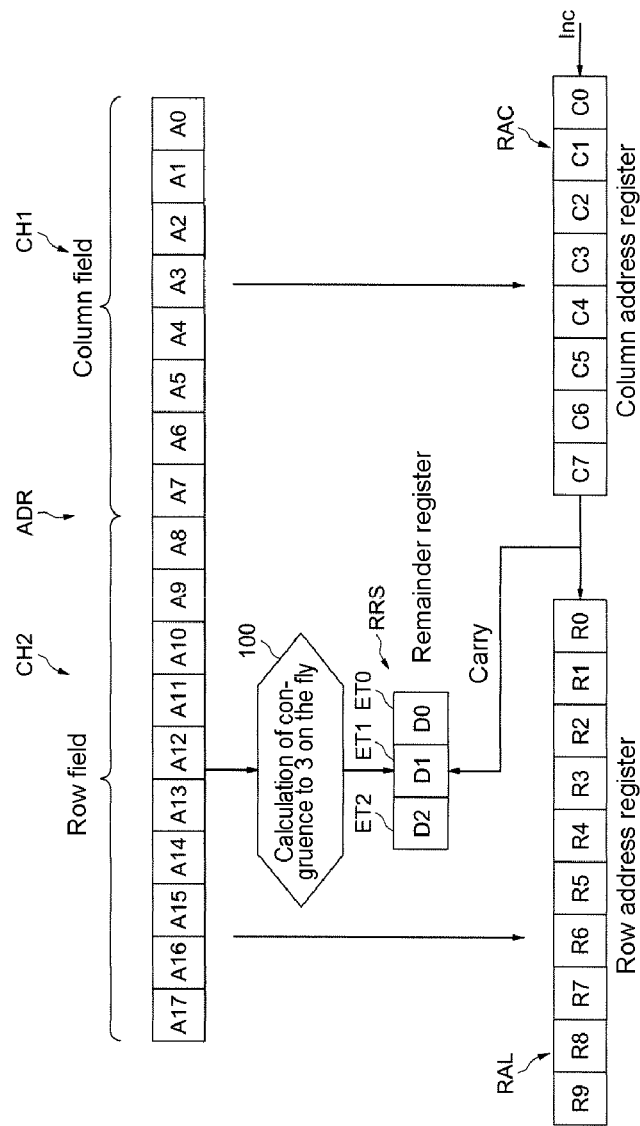
FIGS. 2 to 4 schematically illustrate an exemplary calculation of the remainder of a Euclidean division according to the invention.

Moreover, a Euclidean division of the content of the row field CH2 by m/2k, that is to say in this example by three, is performed on the fly (step 100 FIG. 2). The remainder of this Euclidean division is stored in the stages ET1 and ET2 of a remainder register RRS.

Figure 3:
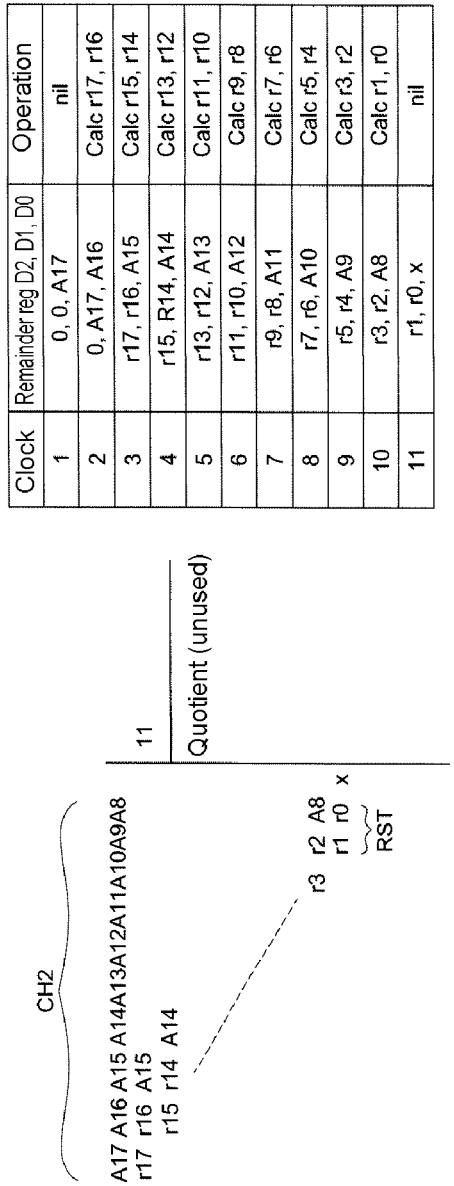

The Euclidean division is performed on the fly, that is to say it is synchronized with the reception of the address bits, which reception is effected high-order bit first. The calculation of the Euclidean division is illustrated in greater detail in FIG. 3.

Thus, at the first clock cycle, the bit A17 of the second field CH2 is stored in the stage ET0 of the register RRS and no operation (nil) is performed.

At the next clock cycle, the bit A17 is transferred into the stage ET1 and the stage ET0 receives the bit A16. The remainder R17, R16 of the Euclidean division by 3 (11 in binary) is calculated and at the next clock cycle, the register RRS contains in its stages ET2, ET1 and ET0 the values r17, r16 and A15 which will constitute the dividend for the next division by 11 (binary) so as to obtain the intermediate remainder r15 and r14.

Thus, during the division, the remainder register RRS also makes it possible to store the intermediate dividends. At each clock cycle, a new remainder of the division by 3 is calculated according to the table illustrated on the right part of FIG. 3.

The new remainder of the division is stored with the next address bit received. At the end of the reception of the bits of the second field CH2, the stages ET2 and ET1 of the remainder register RRS comprise the bits r1 and r0, that is to say the value of the remainder of the Euclidean division, and consequently provide the congruence modulo 3.

The means for calculating the remainder comprise, in addition to the remainder register RRS, a logic circuit MCLR looped back to the remainder register RRS.

Figure 14:
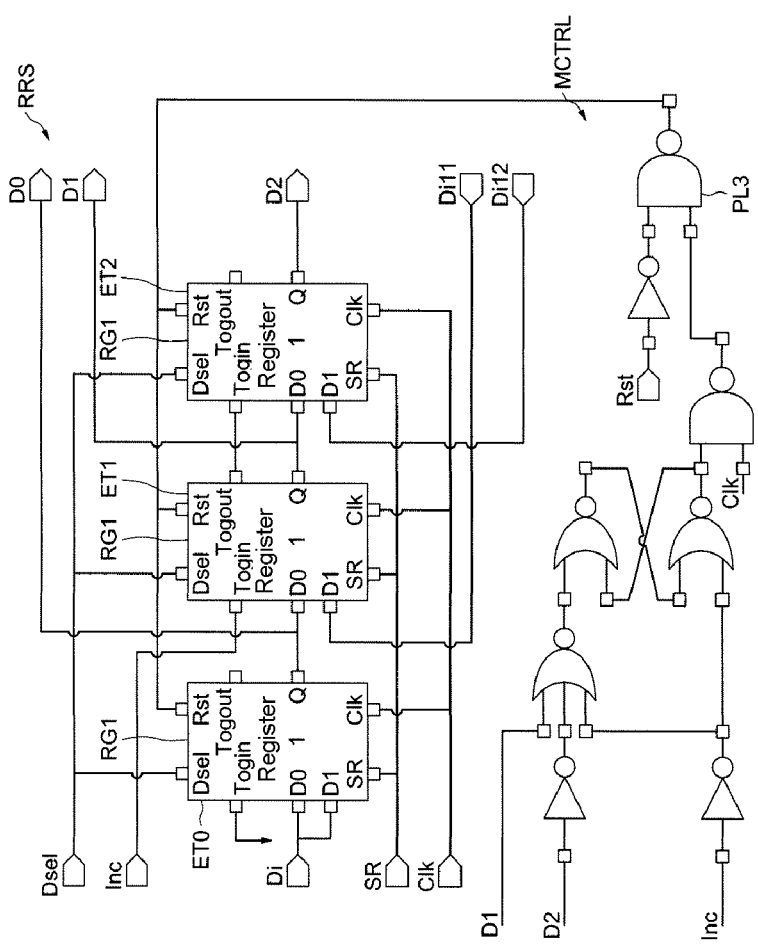
Figure 15:
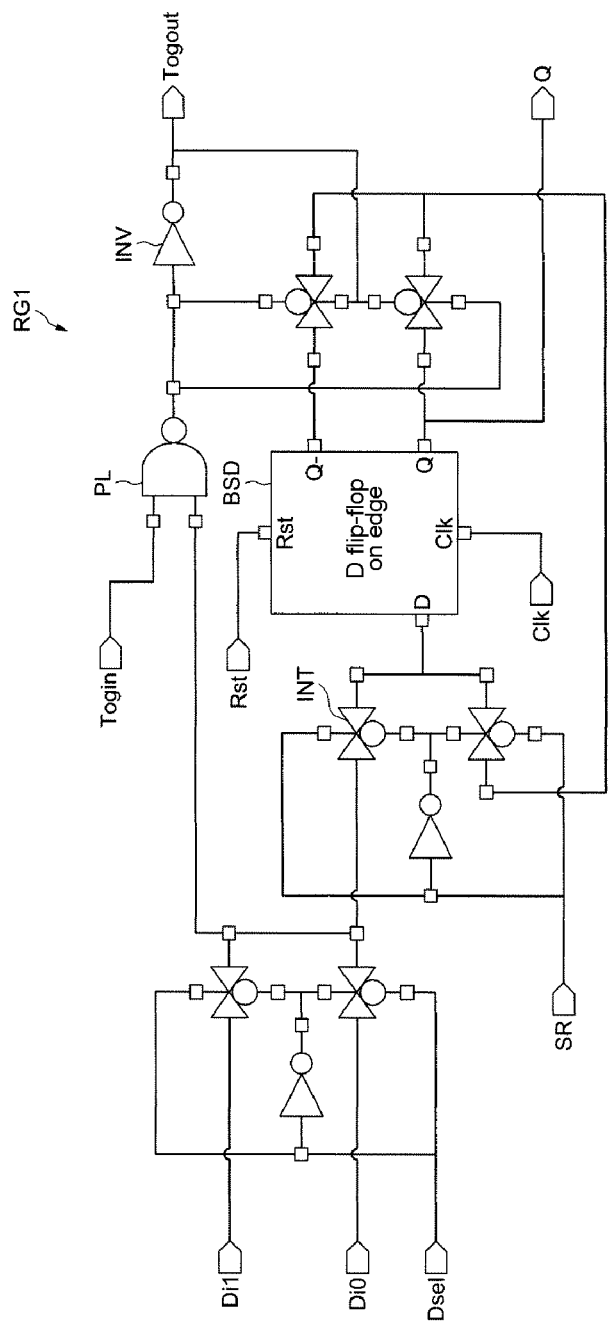

More precisely, and as illustrated in FIG. 14 to which we shall return in greater detail hereinafter, here the remainder register RRS comprises the three stages ET0, ET1 and ET2 each formed of a register RG1 such as that illustrated schematically in FIG. 15. This register RG1 essentially comprises a D flip-flop referenced BSD surrounded by logic components here comprising a logic gate PL, an inverter INV and breakers INT formed of an N-type MOS transistor and of a P-type MOS transistor mounted in parallel.

The logic circuit MCLR (FIG. 4) comprises three inputs D0, D1, D2 connected respectively to the outputs of the stages ET0, ET1 and ET2 of the remainder register RRS and two outputs Q0 and Q1 looped back to respectively two inputs Di11 and Di12 of the stages ET1 and ET2.

Figure 4:
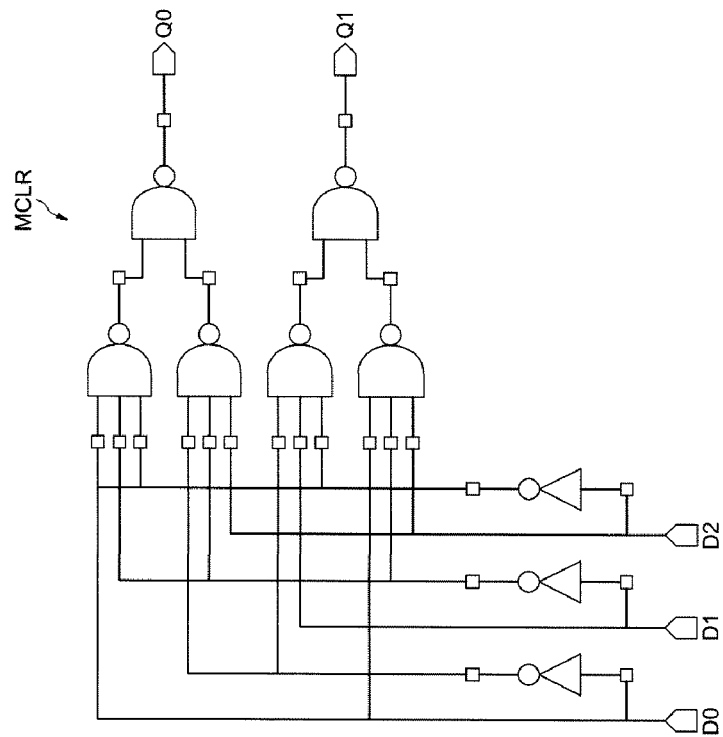

In the example illustrated here of a division by three, the logic circuit MCLR is composed of logic gates and of inverters making it possible to calculate the successive remainders of the Euclidean division in accordance with the truth table TB1 illustrated on the left part of FIG. 4.

The architecture of the physical memory plane, such as illustrated in FIGS. 5$a$ to 5$c$, comprises, in addition to the three blocks of 128 columns (here 128 bytes), three decoding blocks (or banks) BCD0, BCD1 and BCD2 respectively assigned to the decoding of the 128 columns of each block. The addressing of the physical memory plane is therefore done in blocks of $2^k$ (here 128) bytes. These decoding blocks form part of first decoding means which will make it possible to decode the columns of the memory plane. It will be seen hereinafter that these first decoding means also comprise a selection module MSEL (FIGS. 8 and 9) making it possible to select a decoding block BCDi from among the three decoding blocks BCD0-BCD2.

In addition to the first decoding means, the memory device also comprises second decoding means composed here of two row decoders, also called second decoders and referenced DCD20 and DCD21.

In the example illustrated in FIG. 5, these two second decoders are placed between the blocks of 128 physical columns of the physical memory plane.

Given that a physical page of the physical memory plane makes it possible to store 1.5 logical pages of the logical memory plane, there are three different types of page addressing. These various types of addressing are illustrated in FIGS. 5a, 5b and 5c. More precisely, logical page 0 (first logical page) is stored on the first 256 bytes of the physical row or physical page LP0 (FIG. 5a).

Logical page 1 (FIG. 5b) is stored in part on physical page LP0 and in part on physical page LP1. More precisely, the first 128 bytes of logical page 1 are stored on the last 128 bytes of physical page LP0 while the last 128 bytes of logical page 1 are stored on the first 128 bytes of physical page LP1. Finally, as illustrated in FIG. 5c, the two times 128 bytes of logical page 2 are stored on the last two groups of 128 bytes of physical page LP1.

On the other hand, as illustrated in FIG. 5d, the addressing of logical page 3 is performed in a manner analogous to that of logical page 0 but, this time, on the third physical page P2.

Thus, in this example, there are three different types of page addressing, namely a page 0 type of addressing illustrated in FIG. 5a, a page 1 type of addressing illustrated in FIG. 5b and a page 2 type of addressing illustrated in FIG. 5c.

In the page 0 type of addressing, the logical page is decoded by the second left decoder DCD20 which is configured to access a part only of the corresponding physical page or row, namely in the present case the first block of 128 bytes and the second block of 128 bytes of this physical page.

In a page 1 type of addressing, the logical page is decoded by the second left decoder DCD20 and by the second right decoder DCD21. More precisely, the right decoder DCD21 will decode the first 128 bytes of the logical page and is hard-wired so as to access only the 128 right bytes of the corresponding physical page. The left decoder DCD20 will decode the other 128 bytes of the logical page and is hard-wired so as to access only the first 128 bytes of the corresponding physical page LP1.

Finally, in a page 2 type of addressing, the two blocks of 128 bytes of the logical page are decoded by the second right decoder DCD21 which is hard-wired so as to access just the two right blocks of the corresponding physical page LP1.

Of course, in each of these types of addressing, one of the decoding blocks BCDi makes it possible, in combination with the corresponding second decoder, to select a particular column in the physical page considered.

Figures 6, 7:
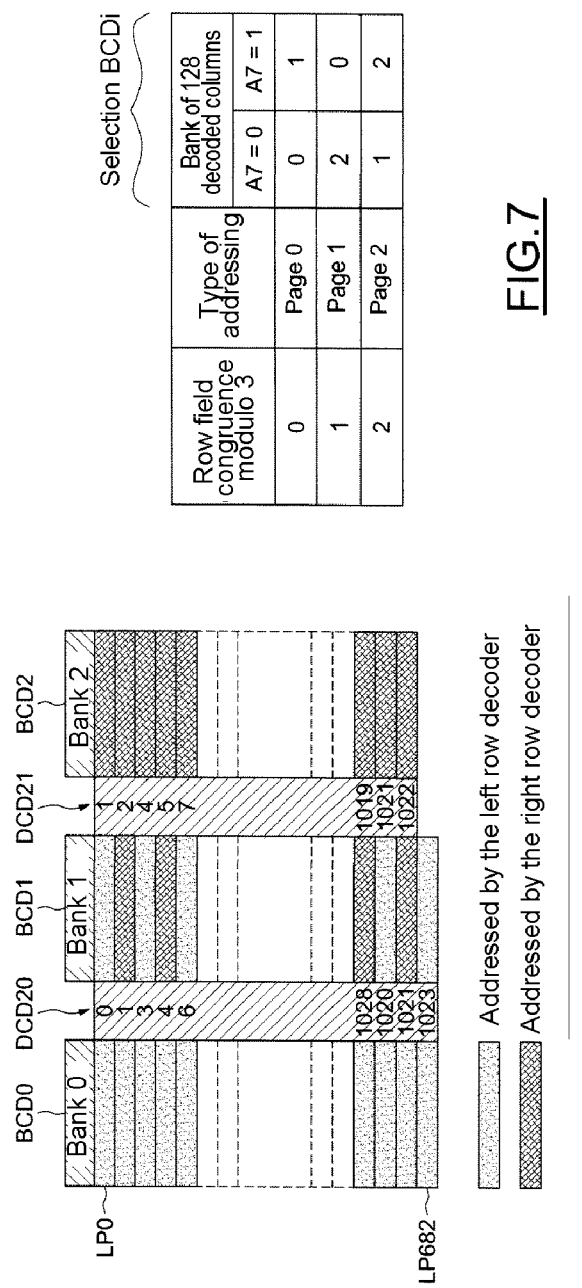

Now referring to FIG. 6, it is seen that each of the second decoders DCD20 and DCD21 does not decode all the logical pages or rows of the logical memory plane. More precisely, each of the second decoders omits to decode one logical page out of three. The second left decoder DCD20 is configured to decode the logical pages from the first (numbered 0) up to the last (numbered 1023) while omitting to decode one logical page out of three, that is to say the logical pages numbered 2, 5, 8, 11, . . . , 1022.

On the other hand, the second right decoder DCD21 is configured to begin to decode the second logical page (numbered 1) up to the penultimate (numbered 1022) while also omitting to decode one logical page out of three, that is to say the logical pages numbered 0, 3, 6, 9, 12, . . . , 1020. Moreover, as illustrated in FIG. 6, each second decoder is hard-wired so as to access only one part of a physical page.

As illustrated in FIG. 7, the selection of the decoding blocks or banks BCDi is performed on the basis of the congruence of the field of rows modulo 3, that is to say of the value of the remainder of the Euclidean division, and of the value of the high-order bit A7 of the column field CH1.

Thus, when the remainder equals zero, the addressing is of page 0 type, and if the bit A7 equals 0, it is then the decoding block BCD0 which is selected, while it is the decoding block BCD1 which is selected if the bit A7 equals 1.

If the remainder equals 1, the addressing is then of page 1 type and it is the decoding block BDC2 which is selected if the bit A7 equals 0, while it is the block BCD0 which is selected if the bit A7 equals 1.

Finally, if the value of the remainder equals 2, the page addressing is then of type 2 and it is the block BCD1 which is selected if the bit A7 equals 0, while it is the block BCD2 which is selected if the bit A7 equals 1.

Figure 8:
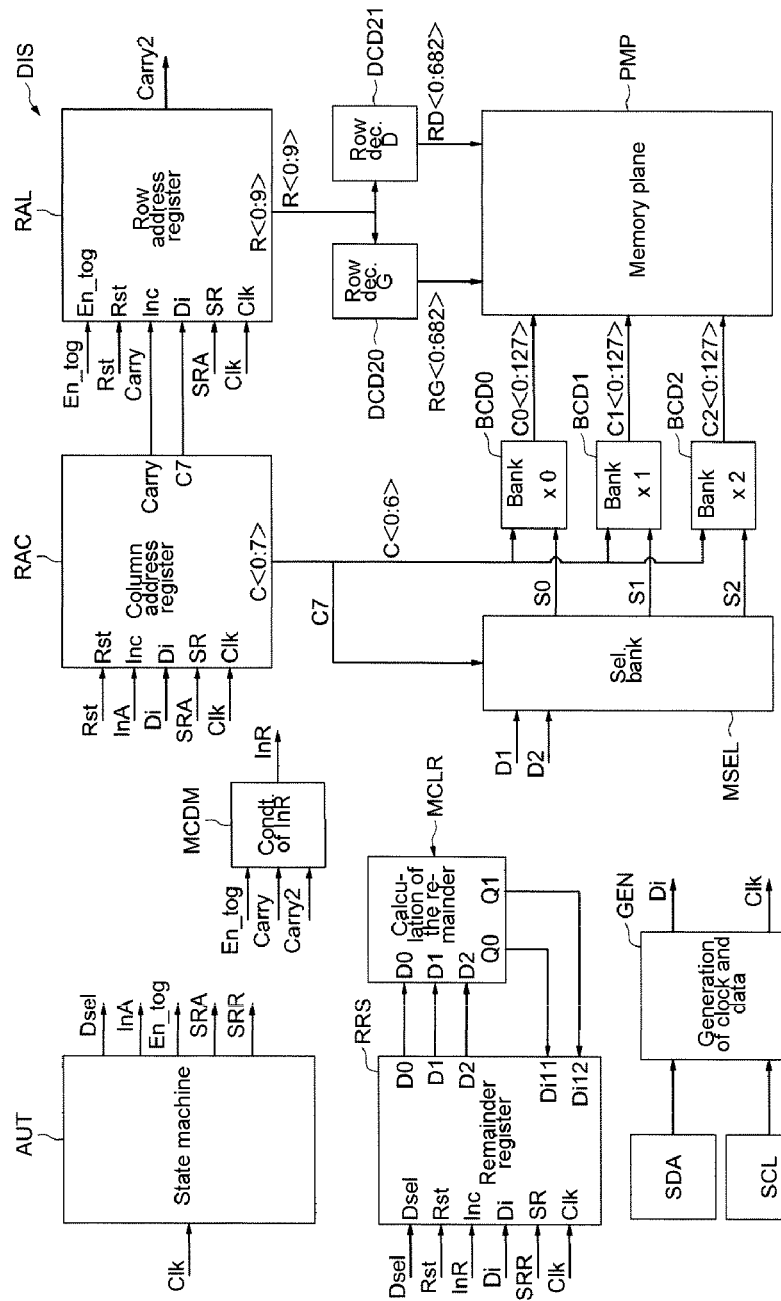
FIG. 8 illustrates a block diagram of an exemplary embodiment of a memory device according to the invention.
Figure 9:
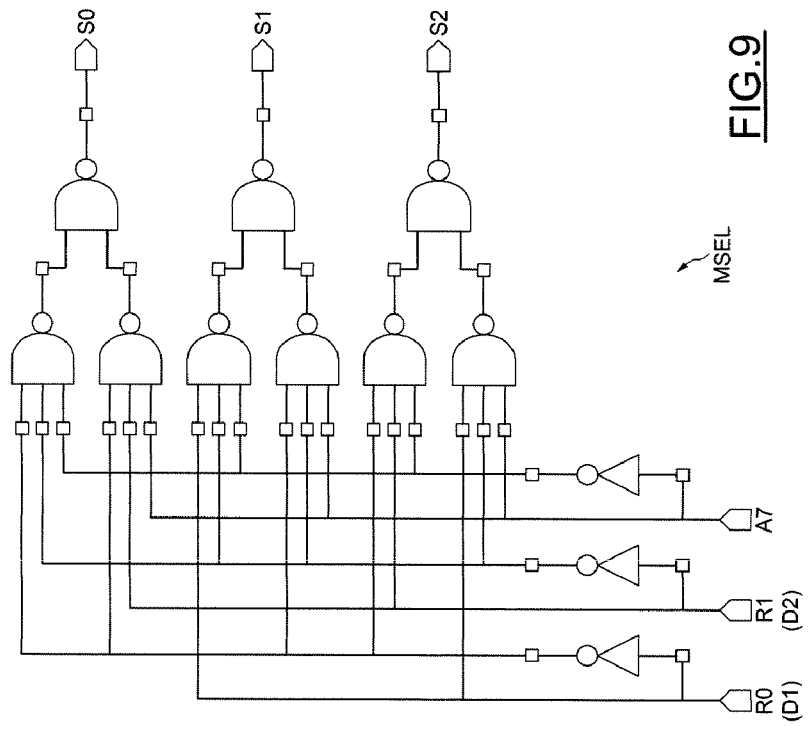
FIGS. 9 to 16 illustrate in greater detail but still schematically certain parts of the device illustrated in FIG. 8.

Now referring more particularly to FIG. 8 and to FIG. 9, it is seen that the selection module MSEL is actually connected to the two stages D1 and D2 of the remainder register which contain the bits R0 and R1 of the remainder as well as to the stage C7 of the column register RAC which contains the high-order bit A7. Consequently, the selection module MSEL delivers as output the three bits S0, S1 and S2 in accordance with the truth table TB2 illustrated on the left part of FIG. 9. These three bits are respectively delivered to the decoding blocks BCD0, BCD1 and BCD2 for the purposes of their selection as a function of the logic value of these bits S0-S2.

Moreover, the seven low-order bits A0-A6 of the column field CH1 that are stored in the stages C0 to C6 of the column register RAC are delivered to the decoding blocks BCD0, BCD1 and BCD2. These then deliver a word of 128 bits making it possible to select the corresponding column in the selected group of columns.

Moreover, the ten bits A8-A17 of the row field CH2, that are respectively stored in stages R0 to R9 of the row address register RAL, are provided to the two second decoders DCD20 and DCD21 which make it possible to decode the corresponding logical page and to address the corresponding physical page portion as a function of their hard-wiring in accordance with what is illustrated in FIG. 6.

Figure 11:
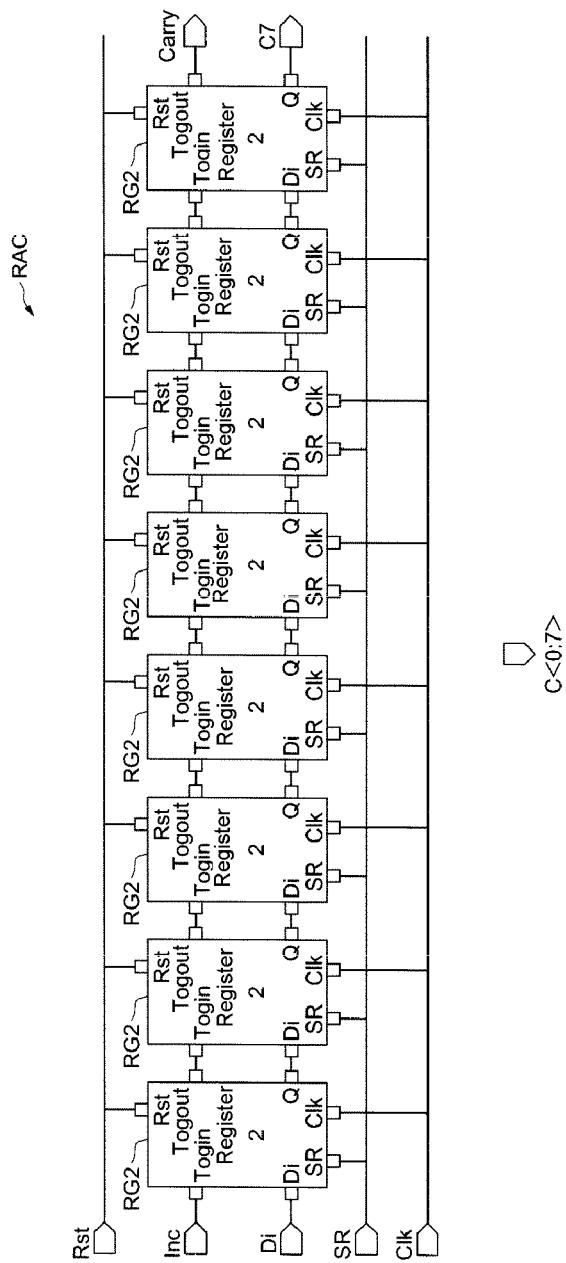
Figure 12:
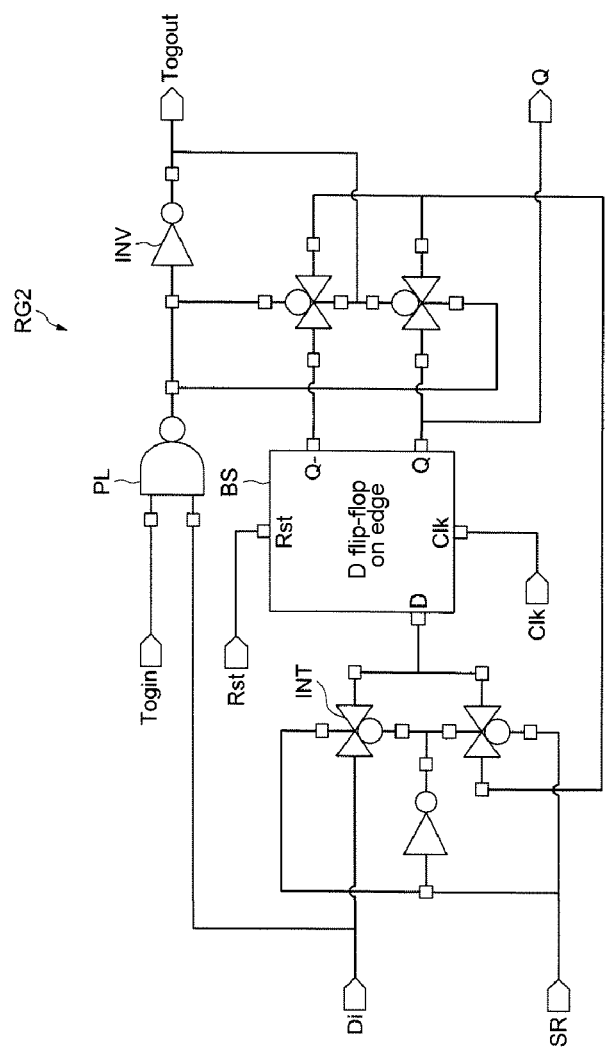

The column address register RAC comprises here, as illustrated in FIG. 11, eight registers RG2 forming the eight stages of the column address register RAC. An exemplary register RG2 is illustrated in FIG. 12. Just like the register RG1, the register RG2 is architectured around a D flip-flop referenced BS and comprises logic circuitry including in particular a logic gate PL, an inverter INV and breakers INT.

The column address register RAC is regulated by the clock signal Clk and can operate as a shift register when the signal SRA takes for example the logic value 1. This operating mode is in particular used while filling the bits of the logical address. The register RAC may also not operate as a shift register and then simply serve as a storage register so as to be able to deliver the eight bits that it contains to the selection module MSEL as well as to the decoding blocks BCDi. The column address register also comprises an incrementation input Inc, a data input Di and a reset input Rst. It possesses a carry output Carry.

Figure 10:
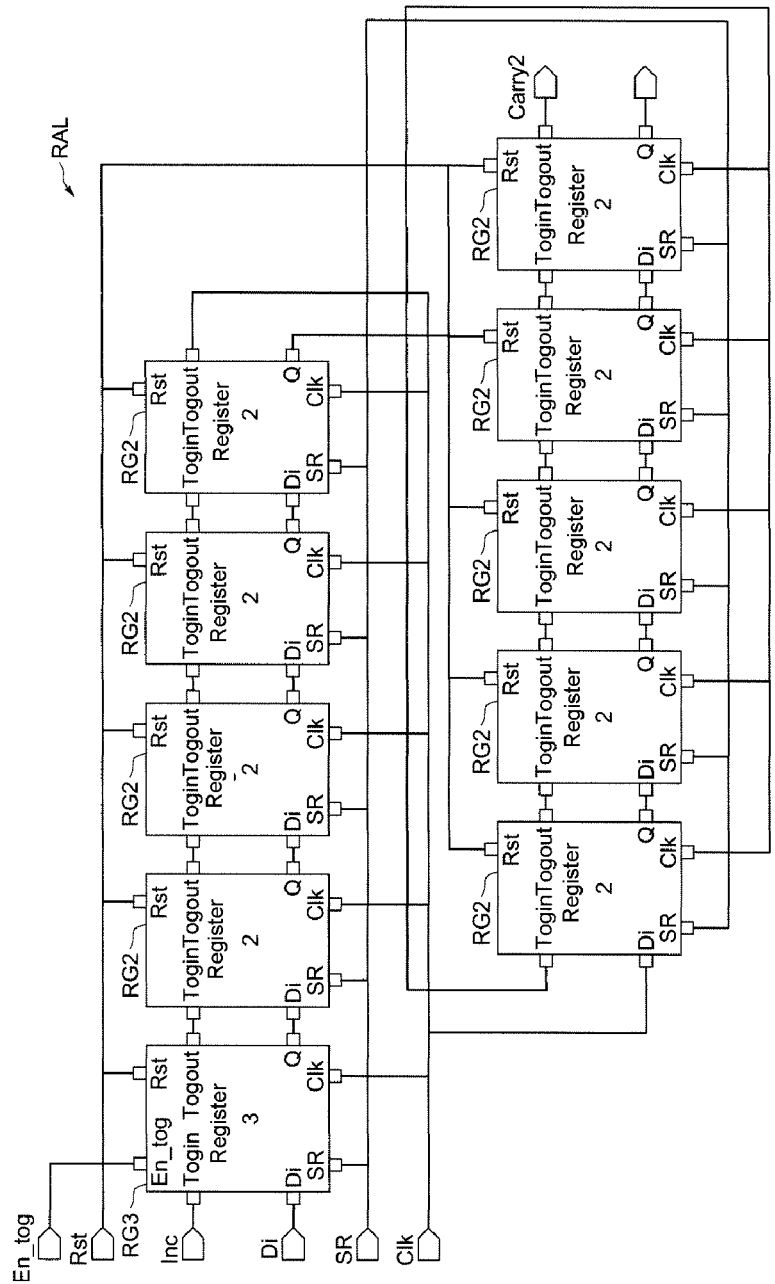

The row address register RAL or second address register comprises, in this example, as illustrated in FIG. 10, ten registers forming the ten stages of the register RAL. Nine of these registers are registers of type RG2 and the tenth, which is the input register, is a register of the type RG3.

Here again, this register is regulated by the clock signal Clk and can operate as a shift register as a function of the logic value of the signal SRA. This operation as a shift register is used in particular when storing a logical address.

Figure 13:
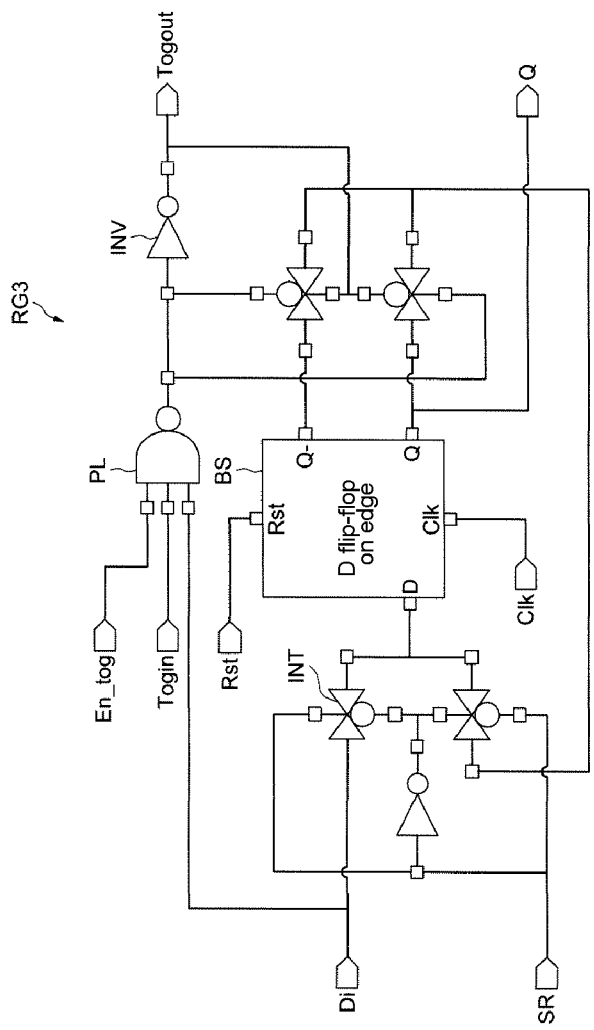

An exemplary embodiment of the register RG3 is illustrated in FIG. 13. Here again there is a D flip-flop referenced BS with logic circuitry comprising a logic gate PL, an inverter INV and breakers INT. The row address register RAL can also be used not as a shift register but as a simple storage register so as to be able to deliver the ten bits R of the row address field to the two row decoders DCD20 and DCD21.

The row address register RAL also comprises an incrementation input Inc connected to the carry output of the column address register RAC as well as a data input Di connected to the last stage C7 of the column address register RAC.

The row address register also possesses a reset input Rst as well as a control input En_tog intended to receive a sequential-read control signal En_tog. This operating mode will be returned to in greater detail hereinafter. The row address register RAL also possesses a carry output Carry2.

In addition to the means which have just been described, the block diagram of the device DIS of FIG. 8 also comprises the remainder register RRS with the calculation means MCLR looped back to the remainder register RRS. This remainder register also comprises a reset to zero input Rst, an incrementation input Inc, a data input Di, an input SR intended to receive a logic signal SRR for optional operation of the remainder register as a shift register. Of course, the remainder register RRS is also regulated by the clock signal CLK and comprises an input Dsel for receiving a deselection signal.

The logic signal InR is delivered to the incrementation input of the remainder register by control means MCDM the function of which will be returned to in greater detail hereinafter. These control means receive as input the sequential-read control signal En_tog, the carry signal Carry and the carry signal Carry2.

Moreover, a state machine AUT receives the clock signal Clk and delivers the logic signals Dsel, the logic signal 1 nA for incrementing the column address register, the signal En_tog as well as the control signals for operation as a shift register SRA and SRR.

Finally, conventional means known per se GEN generate the data signals Di (which can be data proper or else address data) as well as the clock signal CLK so as to satisfy the requirements of the serial protocol.

Figure 17:
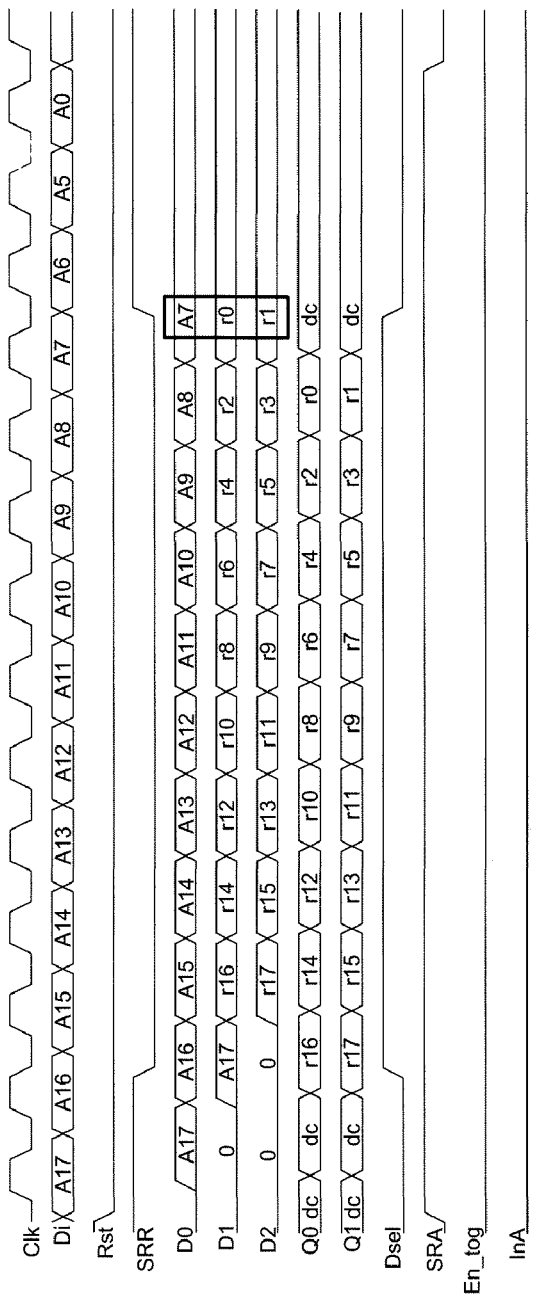
FIGS. 17 to 19 illustrate three timecharts relating to three operating examples of a device according to the invention.

Reference is now made more particularly to FIG. 17, which is a temporal timechart illustrating a phase of introducing the address, for example in a random read mode in which a data item will be read at an arbitrary address, or else in the case of the introduction of a first address in a sequential read mode or in a page-programming mode.

The timechart of FIG. 17 is illustrated with the conventions usually used in this regard. Thus, a dash situated below the name of the logic signal signifies that this logic signal is at zero.

It is therefore seen on the timechart of FIG. 17, that there is a serial introduction of the address bits into the column address register RAC and into the row address register RAL, and then a storage of the bits. There is moreover a calculation in real time of the congruence of the row number, modulo 3, and then a storage of the congruence.

Figure 18:
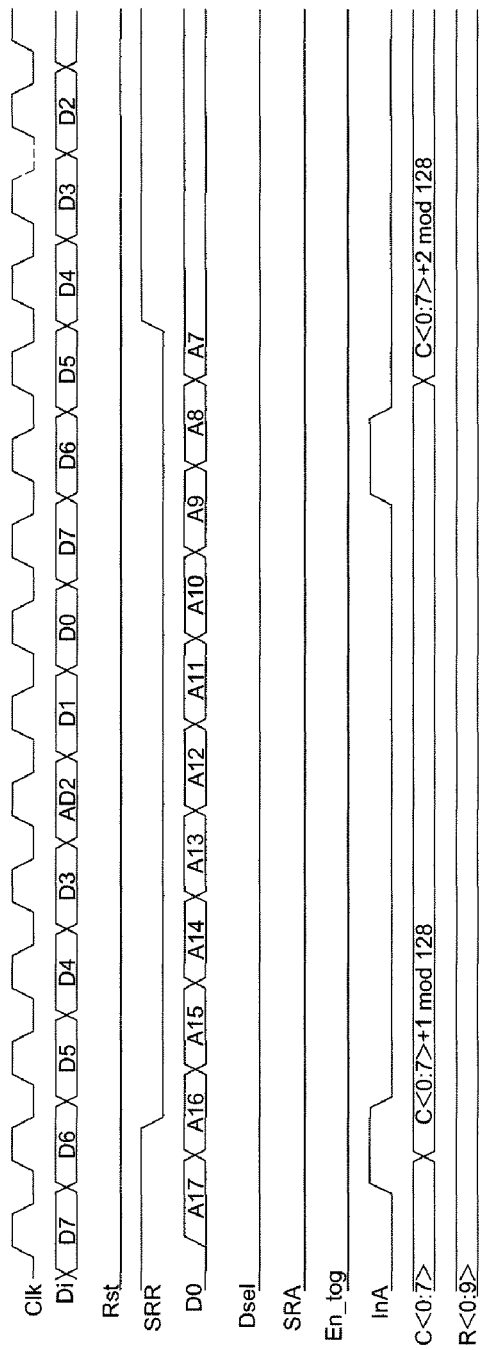

FIG. 18 is a temporal timechart illustrating a phase of introducing the data for a write, for example in a programming in page mode. The data are transmitted as bytes.

There is a periodic incrementation of the column address every eight clock cycles and the row address is not incremented. Moreover, the remainder register is not incremented since because the same page is written to, the value of the remainder is frozen (the type of page addressing is frozen). And, only the value of the bit A7 will make it possible to select, from among the two decoding blocks BCDi designated by the value of the remainder, the one that will have to be active.

Of course, in a page mode programming phase, in which there is a periodic incrementation of the column address every eight clock cycles, the Euclidean division for the first address is calculated only once, and thereafter this Euclidean division is no longer calculated since the column address is incremented.

In the case of a sequential read of the memory after having performed the Euclidean division solely for the first address entered, the addresses will also be periodically incremented. This time, since in a sequential read command it is possible to read all the bytes of the memory, the remainder register will be incremented sequentially also.

This incrementation will be done in the sequence 0; 1; 2; 0. The remainder register is incremented (InR=1) when in sequential read mode (En_tog=1) and at the end of a page (all the column bits equal to 1, thus corresponding to Carry=1) and not on the last page (Carry2=0). Indeed, when on the last page, the remainder register must not be incremented. Likewise, the remainder register is not incremented during the data phases in programming in page mode (En_tog=0).

Figure 16:
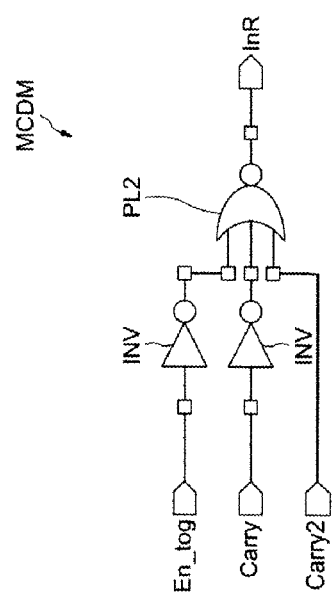

The formulation of the incrementation control signal InR for the remainder register is performed by the control means MCDM with the aid of a logic circuit illustrated in FIG. 16.

This logic circuit comprises two inverters INV receiving respectively the signals En_tog and Carry, as well as a logic gate PL2 (here a NOR gate) of which two inputs are linked respectively to the two outputs of the two inverters INV and whose third input receives the signal Carry2. The output of the logic gate PL2 delivers the signal InR.

Moreover, so that the remainder register is incremented in the sequence 0; 1; 2; 0, that is to say in binary 00; 01; 10; 00, without losing the prohibited value 3 (m/2k) or 11 in binary, there are provided, as illustrated in FIG. 14, supervision means MCTRL comprising a logic circuit formed of logic gates and of inverters. The supervision means MCTRL receive as input the two values of the two stages D1 and D2 of the remainder register as well as the signal Inc, and the output of the NAND logic gate referenced PL3 acts on the Rst input of the registers RG1 forming the three stages ET0, ET1 and ET2 of the remainder register RRS.

Thus, an increment command (Inc=1) with D2=1 and D1=0 sets the flip-flop which will reset in an asynchronous manner the remainder register as soon as the clock signal Clk switches to 1, thereby making it possible to obtain the sequence 00; 01; 1,0; 00 (the state 1,1 corresponding to a remainder 3 being as indicated previously a prohibited state).

Figure 19:
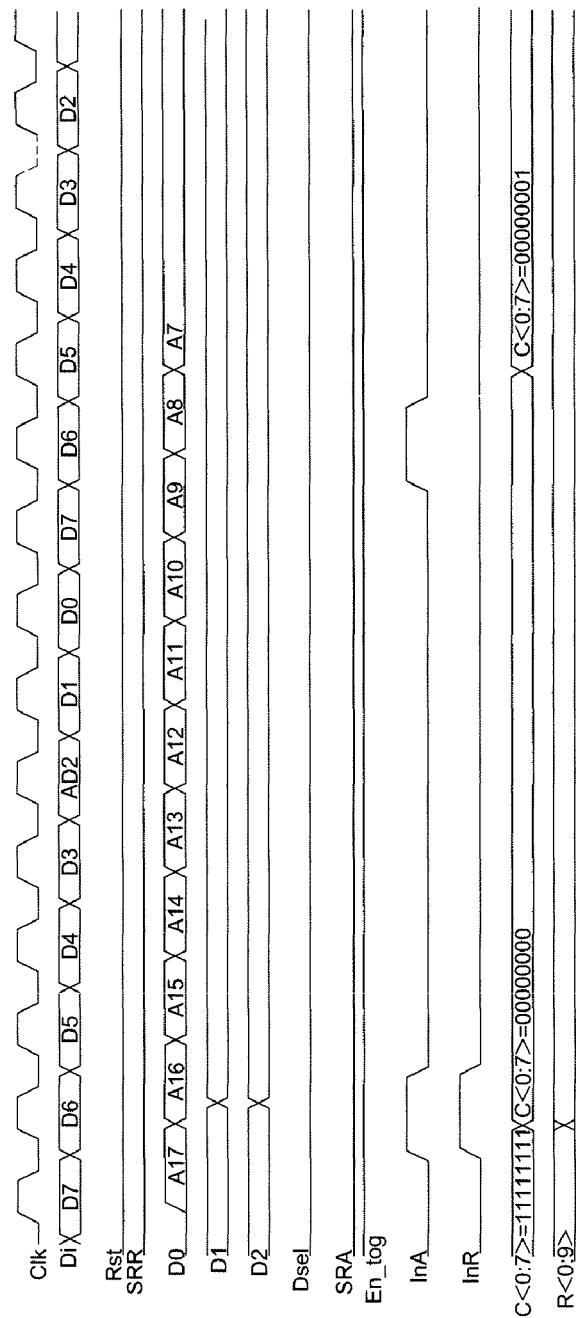

Returning now to FIG. 19, the timechart which is represented therein illustrates an exemplary switch to a following page which is not the last page (the remainder register is incremented). Thus, the data are read in bytes and there is a periodic incrementation of the column address every eight clock cycles, with the row address incremented conditionally at the end of a column. There is actually an incrementation of the remainder register in the sequence 0,1, 2,0 with an absence of incrementation if at the end of a page and on the last page (Carry=1 and Carry2=1).

Figure 21:
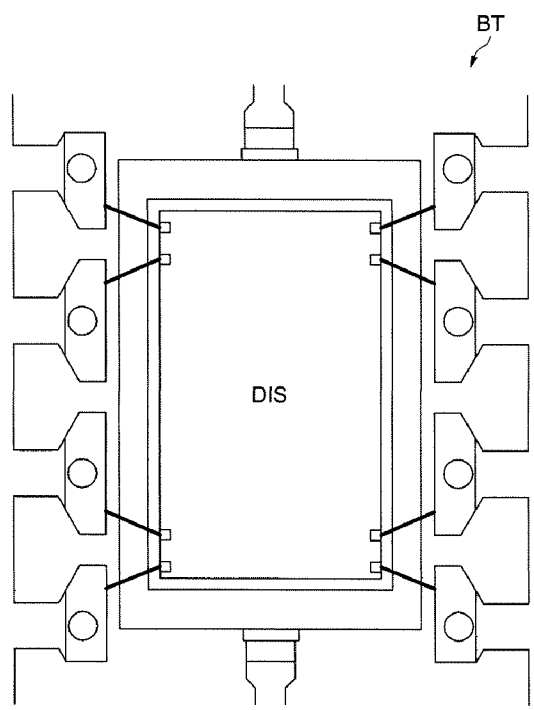

The memory device DIS, which can in this example be a 2-Megabit memory, can thus fit into the cavity of a package BT of the SO8N type (FIG. 21). This cavity has, for example, a dimension of the order of 2.5 mm×4 mm, this currently representing the largest cavity achievable industrially in a reliable manner.

Figure 20:
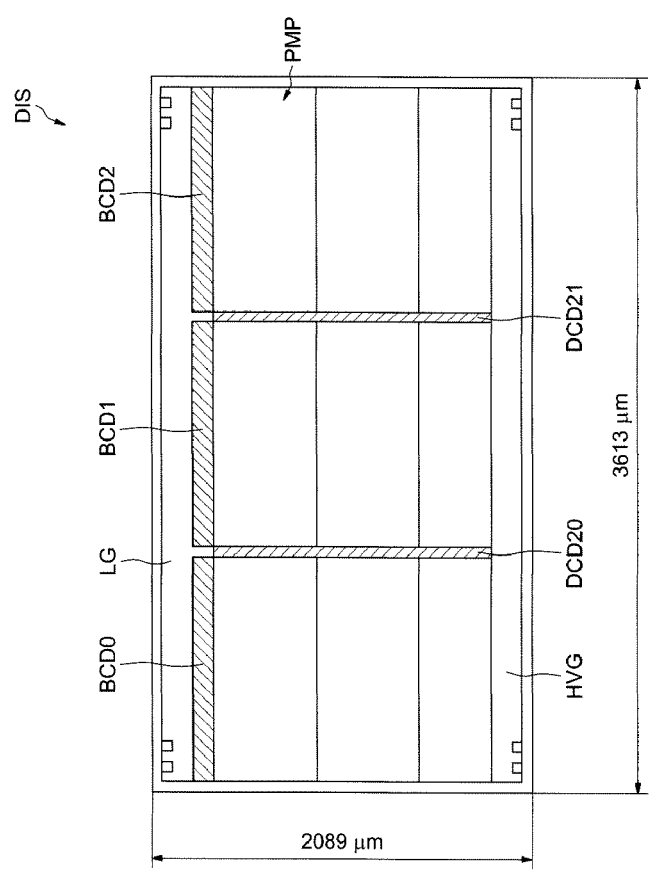
FIGS. 20 and 21 schematically illustrate an exemplary placement of a memory device according to the invention in a package.

The device DIS which has just been described with a physical memory plane of 683 rows and 384 columns exhibits with the high voltage generating circuits HVG and the logic circuit LG, dimensions compatible with an SO8N package (FIG. 20).

It should be noted here that, in practice, returning now to FIG. 6, the second right decoder DCD21 is in practice also embodied until it reaches the physical row LP682 and hardwired so as to be able to also access the block of 128 bytes lying to the right of the physical memory plane in FIG. 6.

Although this is not indispensable, such hard-wiring is generally performed in such a manner as not to break the symmetry of the physical memory plane. These memory locations can be used for example to store test parameters inaccessible to the user.

Moreover, so as to limit the edge effects, the physical memory plane PMP of FIG. 20 will in practice be supplemented by adding on either side of the memory plane one or two additional rows which can be dummy rows.

FIGS. 22a to 22e illustrate another embodiment of a memory device according to the invention. In this example, the presence is still assumed of a 2-Megabit memory with 256 logical columns and 1024 logical rows. However, this time, each logical page comprises blocks of 64 bits ($2^k$=64; k=6). There are therefore, as illustrated in these FIGS. 22a to 22e, five quarters of a physical page per logical page.

A physical memory plane having 320 physical columns and 820 physical rows is therefore obtained. This time a Euclidean division by 5 ($m/2^k$) is performed and there are therefore five possible different types of page addressing.

Here again the memory device comprises two second decoders DCD20 and DCD21 which this time are placed at the two ends of the physical memory plane.

This time, the decoding means comprise five decoding blocks BCD0-BCD4. Here again the selection of one decoding block from among five is performed with the value of the remainder and with the two high-order bits A7 and A6 of the row address field. This time each second decoder omits the decoding of one logical row out of five instead of one logical row out of three as described previously. The remainder register comprises four stages instead of three and the value of the remainder can go from 0 to 4 instead of from 0 to 2.

The truth table for the calculation of the remainder is larger as also is the truth table for selecting the decoding blocks BCDi which corresponds to the table TB3 of FIG. 23.

More precisely, in a page 0 type addressing, the 256 bytes of this page are stored on the first four blocks of 64 bytes of the physical page LP0, and are accessed by the decoder DCD20 in combination with one of the decoding blocks BCD0-BCD3.

In a page 1 type addressing, the first 64 bytes of this logical page are stored on the last 64 columns of the physical page LP0 and are accessed by the decoder DCD21 while the other three blocks of 64 bytes of this logical page 1 are situated on the first three blocks of 64 columns of the physical page LP1 and are accessed by the decoder DCD20.

As regards an addressing of page 2 type, the bytes of such a page are shared between the two physical pages LP1 and LP2 as illustrated in FIG. 22c and are accessed by the decoders DCD21 and DCD20.

In an addressing of page 3 type (FIG. 22d) three quarters of the logical page are distributed over the physical page LP2 and the last quarter over the physical page LP3. The first three quarters are accessed by the right decoder DCD21 while the last quarter is accessed by the left decoder DCD20.

Finally, for an addressing of page 4 type, all the bytes of this page are stored on the last four blocks of the physical page LP3 and are accessed solely by the right decoder DCD21.

The person skilled in the art will know how to modify the means for calculating the remainder as well as the selection module so as to accommodate this new configuration.

Of course, the capacity of the circuit can be different from 2 Megabits, and the size of the logical page different from 256 bits. It is thus possible to consider a 4-Megabit memory and 512-bit pages. In a more general manner, in the case of a memory organized in pages, a page of which comprises $2^p$ columns (or memory locations; bytes for example), a physical page comprises $2^p + 2^k$ bytes, with k varying from 0 to p–1.

This is true except for the last physical page which is smaller (it comprises $2^p$ bytes) although it can be supplemented artificially for the reasons mentioned above. The first physical page comprises logical page 0 and the first $2^k$ bytes of logical page 1. The second physical page comprises the remaining $2^p - 2^k$ bytes of logical page 1 and the first $2^{k+1}$ bytes of physical page 2. The third physical page comprises the remaining $2^p - 2^{k+1}$ bytes of logical page 2 and the first $3 \times 2^k$ bytes of physical page 3. The $n^{th}$ physical page terminates with the first $n.2^k$ bytes of physical page n. If n is equal to $2^{p-k}$, then the next physical page will be organized like the first.

Thus, if p=8 and k=7, the third page is organized like the first, while if k is equal to p–2 and $2^{p-k}$ is equal to 4, the fifth page is organized like the first. The addressing of the memory plane column-wise is done in blocks of 2k bytes. The address decoding uses a Euclidean division by $1+2^p/2^k$. The remainder of the Euclidean division of the logical address by "$1+2^p/2^k$" is used to determine the block of 2k bytes addressed.

The architecture described above in the previous embodiments is analogous, but of course, as a function of the values of p and of k, the number of stages of the row/column address registers and of the remainder register changes. The number of decoding blocks BCDi changes. The truth tables for the remainder calculation and for the selection module MSEL differ.

Finally, the invention is not limited to a memory of serial protocol EEPROM type but can be applied to other types of memories such as for example RAM or SRAM memories with page modes and reads in "burst" mode and likewise to ROM memories with "burst" modes.

What is claimed is:

1. A memory device, comprising:
   a physical memory plane comprising m first physical lines extending along a first direction and n second physical lines extending along a second direction;
   reception means for receiving a logical address designating a first logical line and a second logical line of a matrix logical memory plane, the matrix logical memory plane possessing $2^p$ first logical lines extending along the first direction and $2^q$ second logical lines extending along the second direction, in that m and n are each different from a power of two, m being a multiple of $2^k$, k being less than or equal to p, and the product of m and n being equal to the nearest integer above $2^{p+q}$; and
   means for addressing the physical memory plane configured to address a first physical line and a part only of a second physical line on the basis of the content of the said logical address received and of the remainder of a Euclidean division of a part of the content of this logical address received by $m/2^k$.

2. A device according to claim 1, wherein:
   said received logical address comprises a first field associated with said first logical line and a second field associated with said second logical line; and
   the addressing means comprises first decoding means including calculation means configured to perform the Euclidean division of the content of said second field by $m/2^k$ and first selection means configured to select said first physical line on the basis of the content of said first field and of said remainder of the Euclidean division, and second decoding means configured to address said part of said second physical line on the basis of the content of said second field.

3. A device according to claim 2, in which the device employs a serial protocol and in which the calculation means are configured to perform said Euclidean division on the fly.

4. A device according to claim 3, in which the calculation means comprises a remainder register intended to sequentially receive the bits of the second field, high-order bit first, and a logic circuit looped back to the remainder register and configured to sequentially deliver to the remainder register the binary value of the remainder of the Euclidean division by $m/2^k$ of the dividend formed by the content of the remainder register concatenated on the right with the current bit received from the second field.

5. A device according to claim 4, in which the remainder register possesses nb+1 stages, where nb designates a number compatible with the maximum binary value of the remainder of the said Euclidean division, and the logic circuit possesses nb+1 inputs coupled to the nb+1 stages of the register and nb outputs coupled to nb first stages of the remainder register.

6. A device according to claim 4, in which the reception means comprises a first address register configured to store the content of the first field and a second address register configured to store the content of the second field, the first address register possessing a carry output connected to an incrementation input of the second address register.

7. A device according to claim 6, in which the remainder register comprises an incrementation input, the second address register comprises a carry output, and the first decoding means comprises control means possessing a control input configured to receive a sequential-read control signal, a first input connected to the carry output of the first address register, a second input connected to the carry output of the second address register, and a control output connected to the incrementation input of the remainder register and further configured to deliver an incrementation control signal whose logic value is conditioned by the value of the sequential-read control signal and by the values of the signals present at the first input and at the second input.

8. A device according to claim 4, in which the remainder register comprises an incrementation input configured to receive an incrementation control signal and supervision means configured to authorize a sequential and cyclic incrementation of the value of the content of the remainder register between the zero binary value and the binary value corresponding to $m/2^k-1$.

9. A device according to claim 2, in which the second decoding means comprises a plurality of second decoders capable of decoding all the second logical lines, each second decoder being configured to decode only certain of the second logical lines, and each second decoder assigned to the second logical line designated by the content of the second field of said received logical address is configured to access only a part of a second physical line.

10. A device according to claim 9, comprising only two second decoders.

11. A device according to claim 10, in which one of the second decoders is configured to sequentially decode the said second logical lines starting from the first second logical line while omitting to decode one logical line out of $m/2^k$, and the other second decoder is configured to sequentially decode said second logical lines starting from the second second logical line one while omitting to decode one logical line out of $m/2^k$.

12. A device according to claim 9 in which the reception means comprises a first address register configured to store the content of the first field and a second address register configured to store the content of the second field, the first address register possessing a carry output connected to an incrementation input of the second address register, and in which all the second decoders are connected to the second address register.

13. A device according to claim 1, in which m is equal to $2^p+2^k$, k being a positive or zero integer and less than or equal to p−1.

14. A device according to claim 13, in which the $2^q$ second logical lines of the logical memory plane correspond to $2^q$ logical pages, each comprising $2^p$ logical memory locations configured to store respectively $2^p$ data, and the physical memory plane comprises n physical pages of which n−1 out of the n each comprise $2^p+2^k$ physical memory locations and each correspond to a logical page and to a part of a logical page of neighbouring rank, and one of which comprises $2^p$ physical memory locations and corresponds to a part at least of a logical page.

15. A device according to claim 14, in which the first selection means comprise $1+2^{p-k}$ decoding blocks, each decoding block being configured to address the physical memory plane in blocks of $2^k$ data on the basis of the k low-order bits of the first field and connected to a block of $2^k$ first physical lines, and a selection module configured to select a decoding block from among the $1+2^{p-k}$ decoding blocks on the basis of the remainder of the said Euclidean division and of the p−k high-order bits of the said first field.

16. A device according to claim 15
wherein said received logical address comprises a first field associated with said first logical line and a second field associated with said second logical line; and further comprising
first decoding means;
second decoding means including a plurality of decoders, and configured to address said part of said second physical line on the basis of the content of said second field;
and wherein the plurality of second decoders are disposed between at least some of the blocks of $2^k$ first physical lines.

17. A packaged device containing a memory device according to claim 1.

18. A packaged device of claim 17 wherein the package is of the SO8N or TSSOP8 type, containing a memory device of capacity greater than 1 Megabit.

19. A memory device comprising:
a memory plane comprising n rows and m columns n and m each being different from a power of two, m being a multiple of $2^k$, k being a positive integer;
column decoding circuitry comprising a plurality of decoding blocks respectively assigned to blocks of $2^k$ columns; and
row decoding circuitry comprising a plurality of row decoders each configured to access only a part of the memory plane.

20. A device according to claim 19, in which the row decoding circuitry includes only two row decoders.

21. A device according to claim 19, in which the row decoders are disposed between at least some of the decoding blocks.

22. A device according to claim 20, in which the two row decoders are disposed respectively at two ends of the memory plane.

23. A device according to claim 19, in which the memory plane is of the nonvolatile and electrically erasable and programmable type, organized into memory pages.

24. A package containing a memory device according claim 19.

25. A package according to claim 24, of the SO8N or TSSOP8 type, containing a memory device of capacity greater than 1 Megabit.

26. A method of addressing a memory device, comprising a physical memory plane corresponding to a matrix logical memory plane, possessing $2^p$ first logical lines extending along a first direction and $2^q$ second logical lines extending along a second direction, the physical memory plane comprising m first physical lines extending along the first direction and n second physical lines extending along the second direction, m and n each being different from a power of two, m being a multiple of $2^k$, k being less than or equal to p, and the product of m and n being equal to the nearest integer above $2^{p+q}$, the method comprising:

receiving a logical address designating a first logical line and a second logical line; and addressing of a first physical line and of a part only of a second physical line on the basis of the content of said logical address and of the remainder of a Euclidean division of a part of the content of the logical address by $m/2^k$.

27. A method according to claim 26, wherein:

said logical address comprises a first field associated with said first logical line and a second field associated with said second logical line; and said addressing comprises calculating the remainder of the Euclidean division of the content of the said second field by $m/2^k$, selecting said first physical line on the basis of the content of said first field and of said remainder of the Euclidean division, and addressing of said part of the said second physical line on the basis of the content of said second field.

28. A method according to claim 27, applied to a memory device of serial protocol type, in which the calculation of the remainder of the Euclidean division is performed on the fly.

29. A method according to claim 28, in which the calculation of said remainder comprises:

sequentially storing bits of the second field, high-order bit first, in a remainder register; and calculating and sequentially delivering to the remainder register the binary value of the remainder of the Euclidean division by $m/2^k$ of the dividend formed by the current content of the remainder register concatenated on the right with the current bit received from the second field.

30. A method according to claim 29, furthermore comprising a sequential read mode comprising after reception of a logical address and calculation of a first value of the remainder of the Euclidean division, a sequential and cyclic incrementation of the value of the content of the remainder register from said first value and between the zero binary value and the binary value corresponding to $m/2^k-1$.

31. A method according to claim 27 further comprising addressing of respective parts of a plurality of second physical lines, in which the addressing of the part of a plurality of second physical lines is performed with a plurality of second decoders configured to decode all the second logical lines, in which each second decoder is configured to decode only certain of the second logical lines, and a part only of a second physical line is accessed with the decoder or each decoder assigned to the second logical line designated by the content of the second field of the said logical address received.

32. A method according to claim 31, in which only two second decoders are used.

33. A method according to claim 32, in which one of the second decoders is configured to sequentially decode said logical lines from the first logical line while omitting to decode one logical line out of $m/2^k$, and the other second decoder is configured to sequentially decode said logical lines from the second logical line while omitting to decode one logical line out of $m/2^k$.

34. A method according to one of claim 26, for addressing a memory plane in which m is equal to $2^p+2^k$, k being a positive or zero integer and less than or equal to p−1.

35. A method according to claim 34, for addressing a memory plane in which the $2^q$ second logical lines of the logical memory plane correspond to $2^q$ logical pages each comprising $2^p$ logical memory locations configured to store respectively $2^p$ data, and the physical memory plane comprises n physical pages of which n−1 out of the n each comprise $2^p+2^k$ physical memory locations and each correspond to a logical page and to a part of a logical page of neighbouring rank, and one of which comprises $2^p$ physical memory locations and corresponds to a part at least of a logical page.

36. A method according to claim 35, in which the selection of the said first physical line on the basis of the content of the said first field and of said remainder of the Euclidean division comprises a selection of a block of $2^k$ first physical lines on the basis of the remainder of said Euclidean division and of the p−k high-order bits of the said first field, and a selection of said first physical line on the basis of the k low-order bits of the first field.

37. A method according to claim 26, in which the memory plane is of the nonvolatile and electrically erasable and programmable type, in particular organized into memory pages.

\* \* \* \* \*

UNITED STATES PATENT AND TRADEMARK OFFICE
CERTIFICATE OF CORRECTION

| | | |
|---|---|---|
| PATENT NO. | : 8,572,351 B2 | Page 1 of 1 |
| APPLICATION NO. | : 12/902707 | |
| DATED | : October 29, 2013 | |
| INVENTOR(S) | : Tailliet | |

It is certified that error appears in the above-identified patent and that said Letters Patent is hereby corrected as shown below:

In the Claims:

In Col. 16, line 66, claim 24, delete "according" and insert --according to--.

Signed and Sealed this
Twenty-eighth Day of January, 2014

Michelle K. Lee
*Deputy Director of the United States Patent and Trademark Office*